(12) United States Patent
Kim et al.

(10) Patent No.: US 11,330,732 B2
(45) Date of Patent: May 10, 2022

(54) HOUSING, METHOD FOR MANUFACTURING HOUSING, AND ELECTRONIC DEVICE COMPRISING SAME

(71) Applicant: Samsung Electronics Co., Ltd., Gyeonggi-do (KR)

(72) Inventors: Hakju Kim, Gyeongsangbuk-do (KR); Se Jin Kim, Gyeongsangbuk-do (KR); Hosoon Lee, Daegu (KR); Seon-Jung Kim, Daegu (KR); Wanju Sin, Gyeongsangbuk-do (KR); Kyuin Lee, Seoul (KR); Jiwoon Lim, Gyeongsangbuk-do (KR); Jong Wan Jeong, Gyeongsangnam-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 215 days.

(21) Appl. No.: 16/481,137

(22) PCT Filed: Nov. 22, 2017

(86) PCT No.: PCT/KR2017/013323
§ 371 (c)(1),
(2) Date: Jul. 26, 2019

(87) PCT Pub. No.: WO2018/139749
PCT Pub. Date: Aug. 2, 2018

(65) Prior Publication Data
US 2021/0130974 A1    May 6, 2021

(30) Foreign Application Priority Data

Jan. 26, 2017    (KR) .................. 10-2017-0012885

(51) Int. Cl.
*H05K 5/04*    (2006.01)
*C25D 11/18*    (2006.01)
(Continued)

(52) U.S. Cl.
CPC ............... *H05K 5/04* (2013.01); *C23C 28/04* (2013.01); *C25D 11/04* (2013.01); *C25D 11/16* (2013.01);
(Continued)

(58) Field of Classification Search
CPC ......... C25D 11/18; C25D 11/04; C25D 11/24; C25D 11/16; C25D 11/26; C25D 11/30;
(Continued)

(56) References Cited

U.S. PATENT DOCUMENTS

2003/0075452 A1* 4/2003 Hsu .................. C25D 11/18
205/203
2010/0183869 A1* 7/2010 Lin ................... C25D 11/022
428/332
(Continued)

FOREIGN PATENT DOCUMENTS

JP      2014-58744 A    4/2014
KR  10-2009-0123615 A   12/2009
(Continued)

*Primary Examiner* — Farid Seyedvosoghi
(74) *Attorney, Agent, or Firm* — Cha & Reiter, LLC

(57) ABSTRACT

According to various embodiments, a method for manufacturing a metal housing can be provided, comprising: a step of forming a metal base made of a metal material; a step of pretreating the surface of the metal base such that the surface has a predetermined gloss and flatness; an anodizing step of forming a predetermined oxide film on the flat surface of the metal base; a step of coloring the oxide film by using a colorant having a desired color; a sealing step for maintaining the performance and characteristics of the colorant on the colored oxide film; and a step of laminating at least one deposition layer on the upper part of the sealed oxide film.

11 Claims, 9 Drawing Sheets

(51) Int. Cl.
*C23C 28/04* (2006.01)
*C25D 11/26* (2006.01)
*C25D 11/30* (2006.01)
*H04M 1/02* (2006.01)
*C25D 11/04* (2006.01)
*C25D 11/24* (2006.01)
*C25D 11/16* (2006.01)
*H05K 5/00* (2006.01)

(52) U.S. Cl.
CPC ............. *C25D 11/24* (2013.01); *C25D 11/26* (2013.01); *C25D 11/30* (2013.01); *H04M 1/02* (2013.01); *H05K 5/00* (2013.01); *C25D 11/18* (2013.01)

(58) Field of Classification Search
CPC ...... C25D 11/246; C25D 11/243; H05K 5/04; H05K 5/00; C23C 28/04; C23C 28/40; C23C 28/42; C23C 28/44; C23C 28/042; C23C 28/048; H04M 1/02; H04M 1/0283
See application file for complete search history.

(56) References Cited

U.S. PATENT DOCUMENTS

| | | | | |
|---|---|---|---|---|
| 2010/0282455 | A1* | 11/2010 | Maegawa | B01D 53/265 165/181 |
| 2011/0056836 | A1 | 3/2011 | Tatebe et al. | |
| 2011/0214993 | A1* | 9/2011 | Akana | C25D 11/16 205/50 |
| 2012/0025132 | A1* | 2/2012 | Asahi | C08G 59/64 252/76 |
| 2013/0153428 | A1* | 6/2013 | Akana | C25D 11/30 205/50 |
| 2014/0118903 | A1* | 5/2014 | Hwang | C23C 14/081 361/679.01 |
| 2015/0315388 | A1* | 11/2015 | Park | F26B 25/04 428/336 |
| 2016/0025311 | A1* | 1/2016 | Tischler | H05K 1/189 362/232 |

FOREIGN PATENT DOCUMENTS

| | | |
|---|---|---|
| KR | 10-2010-0089197 A | 8/2010 |
| KR | 10-2014-0055690 A | 5/2014 |
| KR | 10-2016-0124717 A | 10/2016 |

* cited by examiner

HOUSING, METHOD FOR MANUFACTURING HOUSING, AND ELECTRONIC DEVICE COMPRISING SAME

CROSS REFERENCE TO RELATED APPLICATIONS

This application is a National Phase Entry of PCT International Application No. PCT/KR2017/013323, which was filed on Nov. 22, 2017, and claims a priority to Korean Patent Application No. 10-2017-0012885, which was filed on Jan. 26, 2017, the contents of which are incorporated herein by reference.

TECHNICAL FIELD

Various embodiments of the disclosure relate to an electronic device. For example, various embodiments of the disclosure relate to a housing, a method for manufacturing the housing, and an electronic device including the housing.

BACKGROUND ART

Electronic devices have come to be applied to various fields that are closely related to human life. These electronic devices are available in various sizes depending on the functions thereof and users' preferences. Therefore, efforts are being made to improve the external beauty of electronic devices in addition to the functional improvement and slimming of the electronic devices. Even if electronic devices available from respective manufacturers have substantially the same function, users prefer an electronic device that is differentiated with a better and more beautiful design thereof.

In recent years, as functional gaps between products from respective manufacturers have been significantly reduced, efforts are being made to increase the stiffness of electronic devices, which are becoming slimmer, and to improve the same from the aspect of design. As a part of this trend, at least some of various structures (e.g., external components) of electronic devices are implemented using metal so as to improve the perceived quality and external beauty of the electronic devices.

DISCLOSURE OF INVENTION

Technical Problem

According to various embodiments, a metal member used in a device or a structure may be made of a material that is relatively light and has excellent rigidity. In recent years, when an anode is applied to a metal member and electrolysis in a dilute-acid solution is performed, an oxide film (e.g., aluminum oxide ($Al_2O_3$) having excellent adhesion with a base metal may be formed by oxygen generated from the anode. Such an oxide film may provide excellent corrosion resistance, improvement of decorative appearance, excellent abrasion resistance, or improved paint adhesion.

In general, a metal member subjected to an anodizing treatment may be configured to exhibit a high gloss on the surface thereof by performing a polishing process before the anodizing treatment, and performing the polishing process once again after the anodizing treatment. Particularly, when chemical polishing (CP) is performed during the anodizing process, the gloss is reduced, and when the polishing process is not performed again after the anodizing process, it is impossible to ensure a high-gloss ceramic texture. Therefore, in order to ensure a high-gloss ceramic texture on the surface of a metal member, it may be necessary to perform a plurality of troublesome steps.

According to various embodiment, it is possible to provide a housing, a method for manufacturing the housing, and an electronic device including the housing.

According to various embodiments, it is possible to provide a housing configured to be capable of exhibiting a high-gloss ceramic texture on the surface thereof through a minimum number of steps, a method for manufacturing the housing, and an electronic device including the housing.

Solution to Problem

According to various embodiments, it is possible to provide a method of manufacturing a metal housing, the method including: forming a metal preform made of a metal material; pre-treating a surface of the metal preform so as to impart the surface with predetermined gloss and flatness; anodizing a flat face of the metal preform so as to form a predetermined oxide film thereon; coloring the oxide film using a colorant having a desired color; performing pore-sealing to maintain the performance and characteristic of the colorant of the colored oxide film; and laminating at least one deposition layer on the oxide film subjected to the pore-sealing.

Advantageous Effects of Invention

According to various embodiments, since the surface treatment of a metal member is completed through a single polishing and deposition process before an anodizing treatment, it is possible to simplify the process and to exhibit an excellent high-gloss ceramic texture.

BEST MODE FOR CARRYING OUT THE INVENTION

Figure 1:
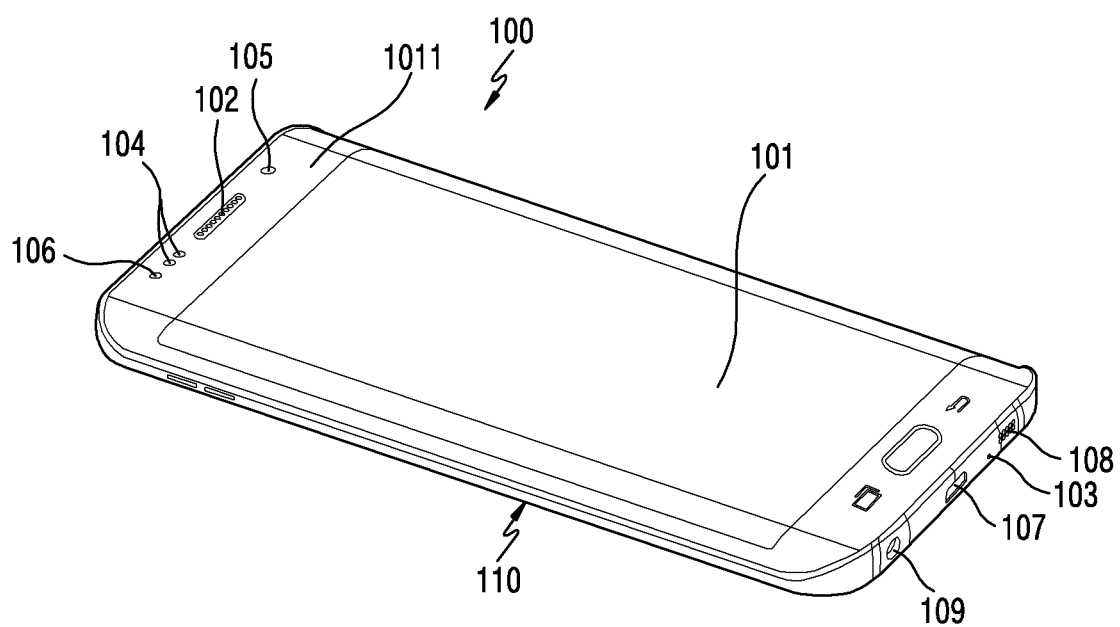
FIG. 1 is a perspective view illustrating the front side of an electronic device including a metal housing according to various embodiments of the disclosure.

Hereinafter, various embodiments of the present invention will be described with reference to accompanying drawings. However, various embodiments of the present invention are not limited to specific embodiments, and it should be understood that modification, equivalent, and/or alternative on the various embodiments described herein can be variously made. With regard to description of drawings, similar components may be marked by similar reference numerals.

In the disclosure disclosed herein, the expressions "have," "may have," "include" and "comprise," or "may include" and "may comprise" used herein indicate existence of corresponding features (for example, elements such as numeric values, functions, operations, or components) and do not preclude the presence of additional features.

In the disclosure disclosed herein, the expressions "A or B," "at least one of A or/and B," or "one or more of A or/and B," and the like used herein may include any and all combinations of one or more of the associated listed items. For example, the term "A or B," "at least one of A and B," or "at least one of A or B" may refer to all of the case (1) where at least one A is included, the case (2) where at least one B is included, or the case (3) where both of at least one A and at least one B are included.

The terms, such as "first," "second," and the like used herein, may refer to various elements of various embodiments of the present invention, but do not limit the elements. For example, such terms do not limit the order and/or priority of the elements. Furthermore, such terms may be used to distinguish one element from another element. For example, "a first user device" and "a second user device" indicate different user devices regardless of the order or priority. For example, without departing from the scope of the present invention, a first element may be referred to as a second element, and similarly, a second element may be referred to as a first element.

It will be understood that when an element (for example, a first element) is referred to as being "(operatively or communicatively) coupled with/to" or "connected to" another element (for example, a second element), it can be directly coupled with/to or connected to another element or coupled with/to or connected to another element via an intervening element (for example, a third element). In contrast, when an element (for example, a first element) is referred to as being "directly coupled with/to" or "directly connected to" another element (for example, a second element), it should be understood that there is no intervening element (for example, a third element).

According to the situation, the expression "configured to (or set to)" used herein may be used as, for example, the expression "suitable for," "having the capacity to," "designed to," "adapted to," "made to," or "capable of". The term "configured to (or set to)" must not mean only "specifically designed to" in hardware. Instead, the expression "a device configured to" may mean that the device is "capable of" operating together with another device or other components. For example, a "processor configured to (or set to) perform A, B, and C" may mean a dedicated processor (for example, an embedded processor) for performing a corresponding operation or a generic-purpose processor (for example, a central processing unit (CPU) or an application processor) which may perform corresponding operations by executing one or more software programs which are stored in a memory device.

Terms used in the present invention are used to describe specified embodiments of the present invention and are not intended to limit the scope of other embodiments. The terms of a singular form may include plural forms unless otherwise specified. Unless otherwise defined herein, all the terms used herein, which include technical or scientific terms, may have the same meaning that is generally understood by a person skilled in the art. It will be further understood that terms, which are defined in a dictionary and commonly used, should also be interpreted as is customary in the relevant related art and not in an idealized or overly formal way, unless expressly so defined herein in various embodiments of the present invention. In some cases, even if terms are terms which are defined in the specification, they may not be interpreted to exclude embodiments of the present invention.

An electronic device according to various embodiments of the present disclosure may include at least one of smartphones, tablet personal computers (PCs), mobile phones, video telephones, electronic book readers, desktop PCs, laptop PCs, netbook computers, workstations, servers, personal digital assistants (PDAs), portable multimedia players (PMPs), Motion Picture Experts Group (MPEG-1 or MPEG-2) Audio Layer 3 (MP3) players, mobile medical devices, cameras, or wearable devices (for example, smart glasses, head-mounted-devices (HMDs), electronic apparels, electronic bracelets, electronic necklaces, electronic appcessory, electronic tattoos, smart mirrors, or smart watches).

According to certain embodiments, the electronic devices may be smart home appliances. The smart home appliances may include at least one of, for example, televisions (TVs), digital video disk (DVD) players, audios, refrigerators, air conditioners, cleaners, ovens, microwave ovens, washing machines, air cleaners, set-top boxes, home automation control panels, security control panels, TV boxes (for example, Samsung HomeSync™, Apple TV™, or Google TV™), game consoles (for example, Xbox™ and PlayStation™), electronic dictionaries, electronic keys, camcorders, electronic picture frames, and the like.

According to another embodiment, the electronic devices may include at least one of medical devices (for example, various portable medical measurement devices (for example, a blood glucose monitoring device, a heartbeat measuring device, a blood pressure measuring device, a body temperature measuring device, and the like), a magnetic resonance angiography (MRA), a magnetic resonance imaging (MRI), a computed tomography (CT), scanners, and ultrasonic devices), navigation electronic devices, global positioning system receivers (GPSs), event data recorders (EDRs), flight data recorders (FDRs), vehicle infotainment devices, electronic equipment for vessels (for example, navigation systems and gyrocompasses), avionics, security devices, head units for vehicles, industrial or home robots, automatic teller's machines (ATMs) of financial institutions, points of sales (POSs) of stores, or internet of things (for example, light bulbs, various sensors, electric or gas meters, sprinkler devices, fire alarms, thermostats, street lamps, toasters, exercise equipment, hot water tanks, heaters, boilers, and the like).

According to a certain embodiment, the electronic devices may include at least one of a part of furniture or buildings/structures, electronic boards, electronic signature receiving devices, projectors, or various measuring instruments (for example, water meters, electricity meters, gas meters, or wave meters, and the like). The electronic devices according to various embodiments may be one or more combinations of the above-mentioned devices. According to a certain embodiment, an electronic device may be a flexible electronic device. Also, electronic devices according to various embodiments of the present disclosure are not limited to the above-mentioned devices, and may include new electronic devices according to technology development.

Hereinafter, an electronic device according to various embodiments will be described with reference to the accompanying drawings. Herein, the term "user" may refer to a person who uses an electronic device or a device that uses an electronic device (e.g., an artificially intelligent electronic device).

According to various embodiments, a metal housing described in accordance with an exemplary embodiment of the disclosure is applied to an electronic device, but is not limited thereto. For example, the metal housing may be used as at least some of the components outside or inside various structures other than an electronic device.

Figure 2:
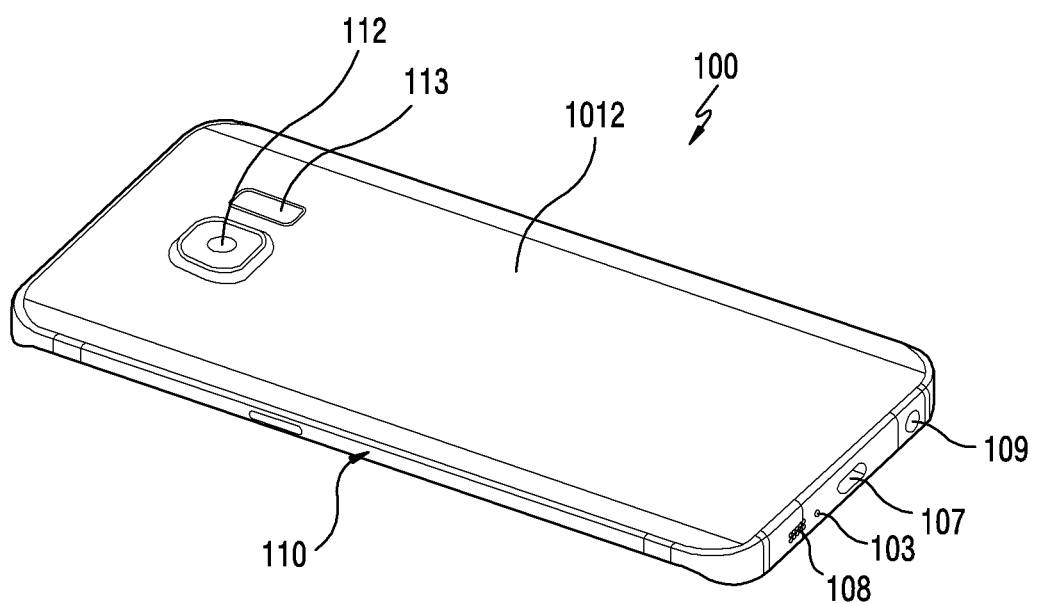
FIG. 2 is a perspective view illustrating the rear side of the electronic device including the metal housing according to various embodiments of the disclosure.

FIG. 1 is a perspective view illustrating the front side of an electronic device including a metal housing according to various embodiments of the disclosure, and FIG. 2 is a perspective view illustrating the rear side of the electronic device including the metal housing according to various embodiments of the disclosure.

Referring to FIGS. 1 and 2, an electronic device 100 may include a housing 110. According to an embodiment, the housing 110 may include a metal member or both a metal member and a non-metal member. According to an embodiment, the display 101 including a window (e.g., a front window or a glass plate) may be disposed on a front face 1011 (e.g., a first face) of the housing 110. According to an embodiment, the display 101 may include a touch sensor so as to operate as a touch screen device. According to an embodiment, the display 101 may include a pressure sensor so as to operate as a pressure-sensitive touch-screen device. According to an embodiment, the electronic device 100 may include a receiver 102, which is disposed in the housing 110 so as to output the voice of a communication partner. According to an embodiment, the electronic device 100 may include a microphone device 103, which is disposed in the housing 110 so as to transmit the user's voice to the communication partner. According to an embodiment, the electronic device 100 may include at least one key input device, which is disposed in the housing 110.

According to various embodiments, components for conducting various functions of the electronic device 100 may be arranged around the receiver 102. The components may include at least one sensor module 104. The sensor module 104 may include at least one of, for example, an illuminance sensor (e.g., an optical sensor), a proximity sensor (e.g., an optical sensor), an infrared sensor, an ultrasonic sensor, or an iris recognition sensor. According to an embodiment, the components may include a front camera device 105. According to an embodiment, the components may include an indicator 106 (e.g., an LED device) configured to allow a user to recognize status information of the electronic device.

According to various embodiments, a speaker 108 may be disposed at one side of the microphone device 103. According to an embodiment, at the other side of the microphone device 103, an interface connector port 107 may be disposed in order to perform a data transmission/reception function with an external device and to receive external power to charge the electronic device 100. According to an embodiment, an ear jack hole 109 may be disposed at one side of the interface connector port 107.

The electronic device 100 according to various embodiments may include a rear window 111 disposed on a rear face 1012 (e.g., the second face). According to an embodiment, a rear camera device 112 may be disposed on the rear window 111, and one or more electronic components 113 may be disposed at one side of the rear camera device 112. According to an embodiment, the electronic components 113 may include at least one of, for example, an illuminance sensor (e.g., an optical sensor), a proximity sensor (e.g., an optical sensor), an infrared sensor, an ultrasonic sensor, a heart rate sensor, and a flash device.

According to various embodiments, the electronic device 100 may include a metal housing 110. According to an embodiment, the housing 110 may be formed of a metallic member capable of being subjected to an anodizing treatment. According to an embodiment, the housing 110 may be formed of at least one of Al, Mg, Zn, Ti, Ta, Hf, or Nb.

According to various embodiments, the housing 110 may be configured to exhibit a high-gloss ceramic texture by laminating at least one deposition layer on a corresponding surface after the anodizing treatment. According to an embodiment, an antifouling layer may be further laminated on the deposition layer. According to an embodiment, the antifouling layer may be formed through a wet or dry hydrophobic or hydrophilic treatment process for enhancing an anti-fingerprint property. According to an embodiment, a method for forming the antifouling layer may include at least one of an AF (anti-fingerprint) treatment process, an invisible-finger (IF) treatment process, or an anti-smudge (AS) treatment process.

According to various embodiments, the housing 110 may be configured to exhibit a high-gloss ceramic texture by forming at least one deposition layer on the oxide film layer formed by the anodizing treatment.

Hereinafter, a method for manufacturing a housing will be described in detail.

Figure 3:
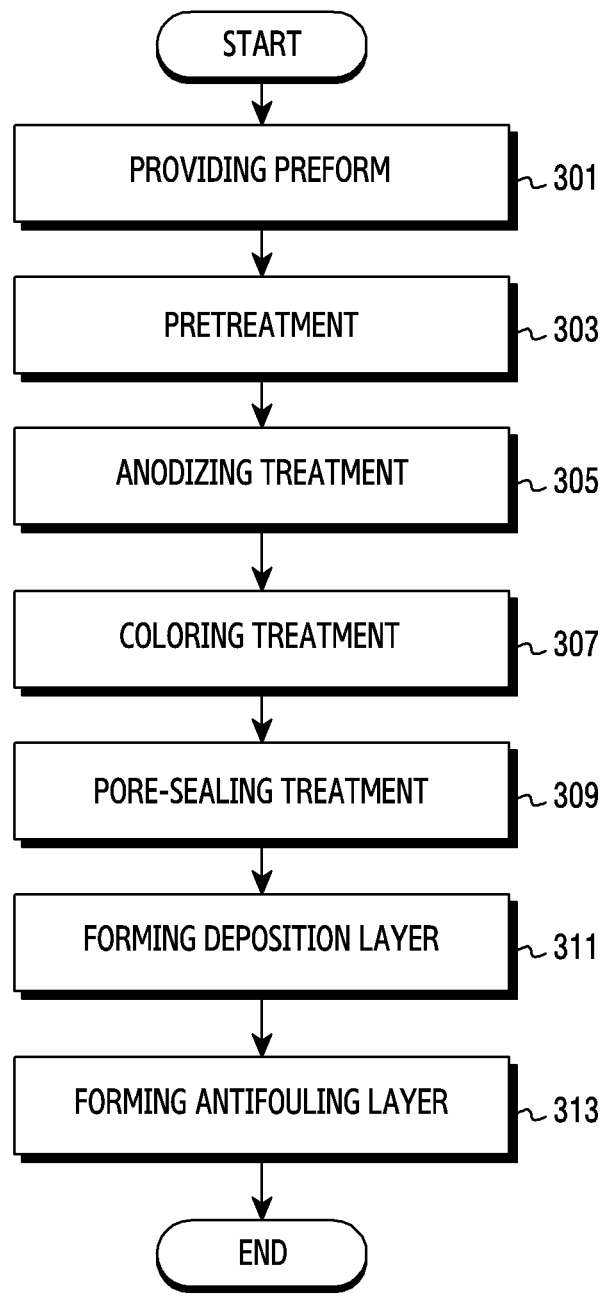
FIG. 3 is a process view illustrating steps of manufacturing a metal housing according to various embodiments of the disclosure.

FIG. 3 is a process view illustrating steps of manufacturing a metal housing according to various embodiments of the disclosure, and FIGS. 4A to 4F are schematic views corresponding to the steps of manufacturing a metal housing according to various embodiments of the disclosure illustrated in FIG. 3.

Figure 4A:
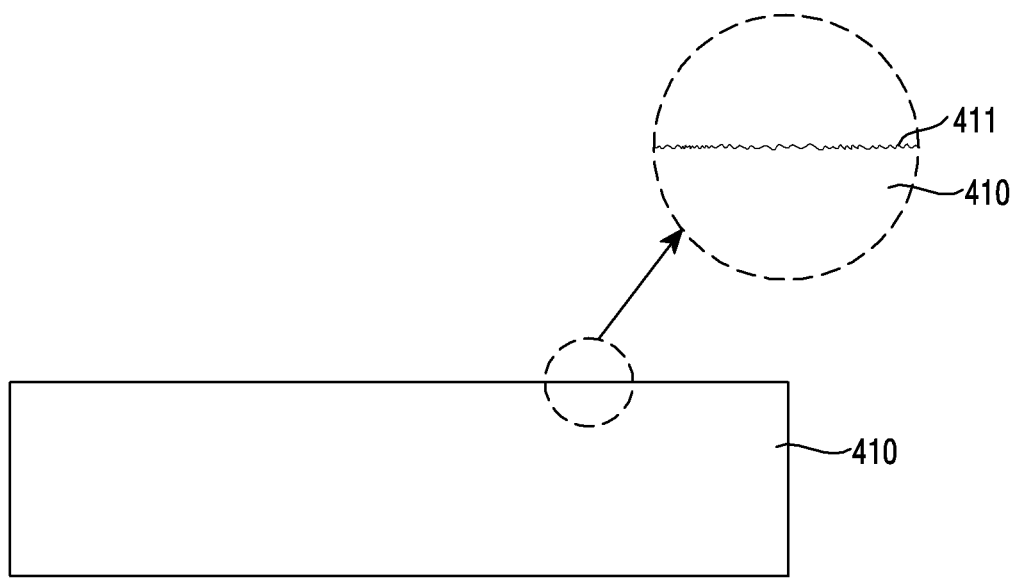
FIGS. 4A to 4F are schematic views corresponding to the steps of manufacturing a metal housing according to various embodiments of the disclosure illustrated in FIG. 3.
Figure 4B:
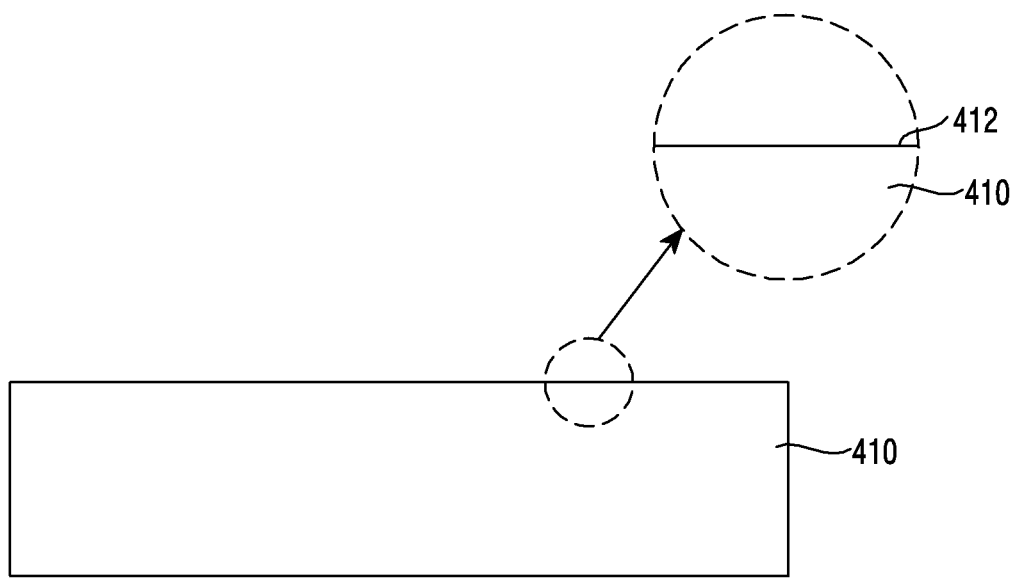
Figure 4C:
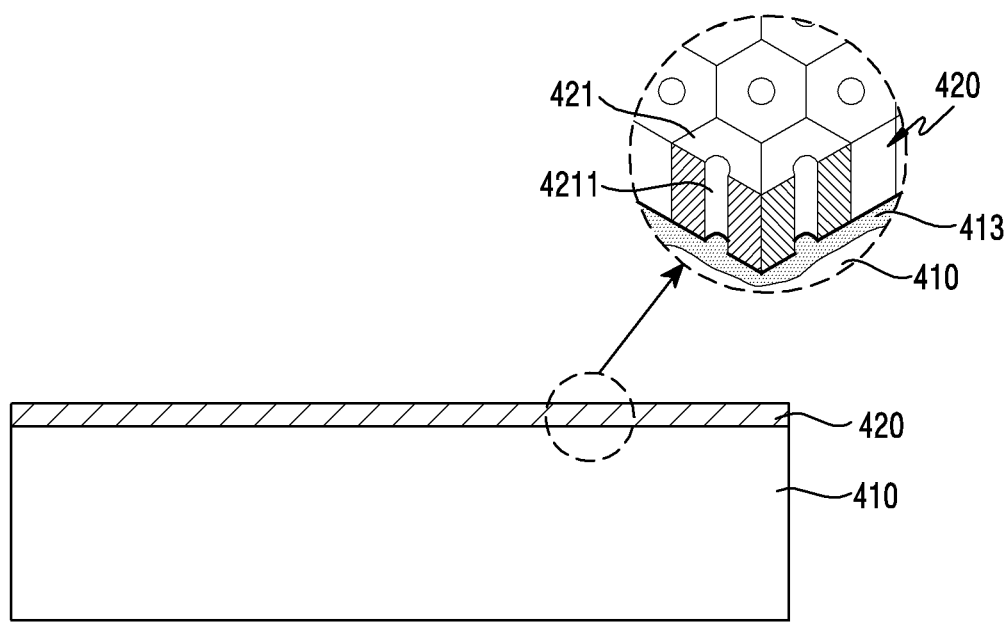
Figure 4D:
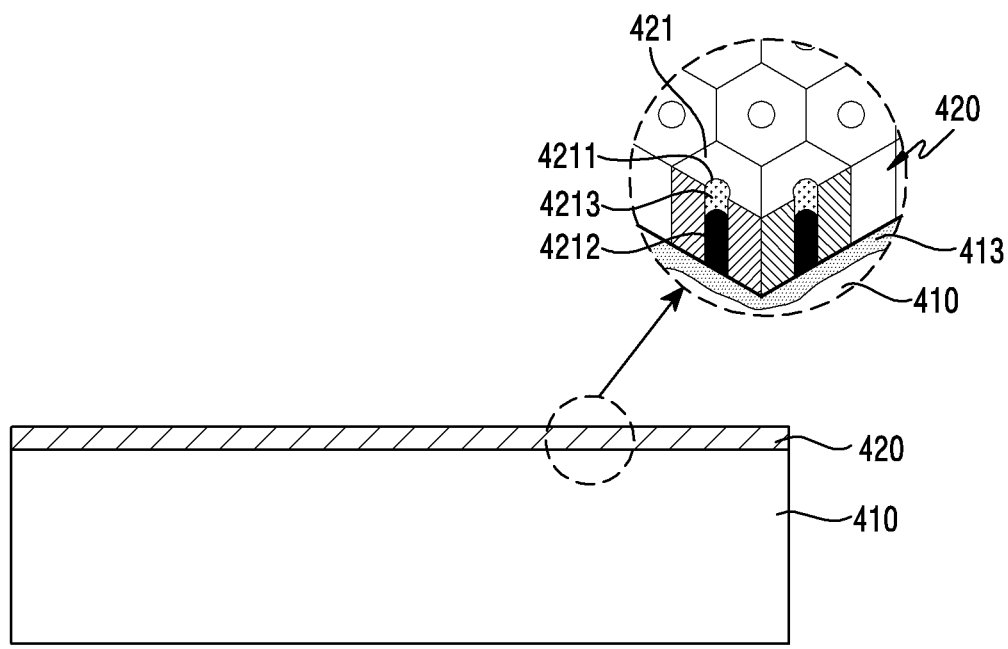
Figure 4E:
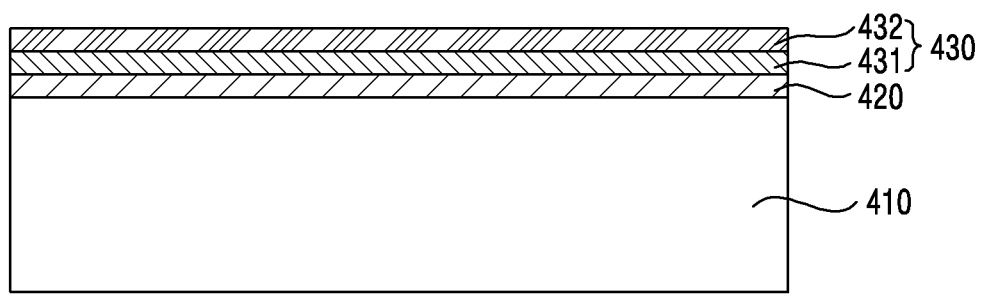
Figure 4F:
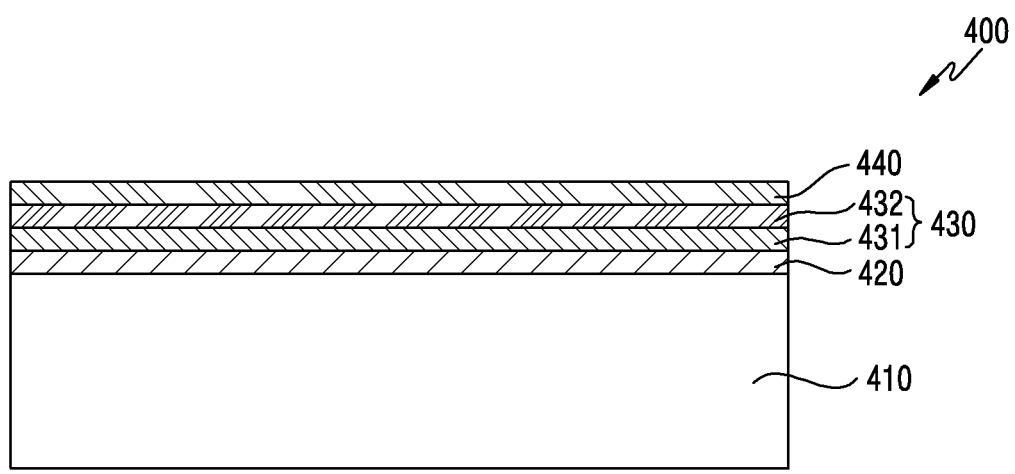

A housing 400 of FIG. 4F may include an embodiment of a housing that is similar to or different from the housing 110 of FIGS. 1 and 2.

Referring to FIG. 3 with reference to FIGS. 4A to 4F, in step 301, a metal preform 410 may be provided. According to an embodiment, the metal preform 410 may be formed in a shape corresponding to a desired area of a device to which the metal preform 410 is applied. According to an embodiment, the metal preform 410 may be formed through cutting by a CNC machine, pressing, forging, injection molding, die-casting, mechanical joining or the like. According to an embodiment, the metal preform 410 may include a material capable of being subjected to an anodizing treatment (e.g., anodic oxide film formation step) to be described later. According to an embodiment, the metal preform 410 may be formed of at least one of Al, Mg, Zn, Ti, Ta, Hf, or Nb. Although a step of processing a housing using a single metal member is described in an exemplary description of the disclosure, a metal preform having a material of a different kind may also be subjected to a surface treatment using the exemplary embodiment of the disclosure.

According to various embodiments, in step 303, a step of pre-treating the surface of the provided metal preform 410 may be performed before the anodizing treatment. Referring to FIG. 4A, the pretreatment process may include a polishing process using an abrasive as a step for flattening an uneven surface 411 that occurs in the process of providing the metal preform described above to form a flat surface 412. When the pretreatment process is completed, as illustrated in FIG. 4B, the metal preform 410 may be formed to have a flat surface.

According to various embodiments, in the step 305, the metal preform 410 subjected to a polishing treatment may be formed with an oxide film 420 through the anodizing treatment, as illustrated in FIG. 4C. According to an embodiment, the metal preform 410 may include a barrier layer 413 formed by contact between metal ions and oxygen ions, and an oxide film 420 formed by volume expansion on the barrier layer 413. According to an embodiment, the metal preform 410 may include an oxide film formed to have different properties depending on the composition and concentration of various treatment solutions, an additive, the temperature of the treatment solutions, voltage, the current, or the like. According to an embodiment, the oxide film 420 subjected to the anodizing treatment may include a plurality of hexagonal cells 421, each including a pore 4211 (e.g., a micro-hole) having a predetermined depth. According to an embodiment, an oxide film treatment process may generally include a CP, EP or desmutting treatment process performed beforehand.

According to various embodiments, in steps 307 and 309, a coloring step and a pore-sealing process may be performed on the metal preform 410 subjected to the anodizing treatment. According to an embodiment, as illustrated in FIG. 4D, a colorant 4212 of a desired color may be introduced into the pore 4211 formed in each cell 421 of the oxide film 420. According to an embodiment, the pore 4211 into which the colorant 4212 is introduced to a predetermined depth may be sealed by a sealant 4213 at the upper portion thereof by being subjected to a pore-sealing treatment. According to an embodiment, the colorant 4212 may include a paint containing an organic/inorganic pigment, an organic dye, silver, pearl, or the like.

According to various embodiments, the pore-sealing process is performed in order to improve the corrosion resistance and antifouling property of the oxide film 420. The oxide film may be treated in a sealing bath containing boiling water, nickel acetate, or the like at a predetermined temperature (e.g., 40 degrees C., 80 degrees C., or higher), or may be subjected to a hydrating treatment with a pressure of 3 atm or higher in steam of 100 degrees C. or higher.

According to various embodiments, at least one deposition layer 430 may be formed on top of the oxide film 420 that has been subjected to the coloring treatment and the pore-sealing treatment in step 311. Referring to FIG. 4E, the deposition layer 430 may include a first deposition layer 431 and a second deposition layer 432 laminated on the first deposition layer 431. However, the disclosure is not limited thereto, and two or more deposition layers may be formed. According to an embodiment, physical vapor deposition (PVD) or chemical vapor deposition (CVD) may be used to form the deposition layer 430.

According to an embodiment, the deposition layer 430 may be formed using at least one of a Ti-based material, a Sn-based material, a Cr-based material, a Si-based material, a Zr-based material, and an Al-based material. According to an embodiment, the deposition layer 430 may include at least one of $TiO_2$, TiN, TiCN, and $SiO_2$. According to an embodiment, the deposition layer 430 may include at least one of a silicon oxide film ($SiO_2$), a titanium oxide film ($TiO_2$), an aluminum oxide film ($Al_2O_3$), a zirconium oxide film ($ZrO_2$), and a tantalum oxide film ($Ta_2O_5$). According to an embodiment, the deposition layer 430 may be formed such that at least two materials, for example, at least two materials of $SiO_2$, $TiO_2$, $Ti_3O_5$, $Al_2O_3$, $ZrO_2$, and $Ta_2O_5$, among oxides, SiN, $SiN_x$, $Si_3N_4$, TiN, ZrN, and AlN, among nitrides, or TiC, SiC, WC, and CrC, among carbonates, are laminated multiple times.

According to various embodiments, the first deposition layer 431 and the second deposition layer 432, which form multiple layers, may be formed of different materials. According to an embodiment, the deposition layer 430 may be formed by alternately depositing at least two deposition materials multiple times. According to an embodiment, the deposition layer 430 may be formed by alternately depositing a first deposition material, in which at least two deposition materials are mixed to exhibit a first refractive index, and a second deposition material, which exhibits a second refractive index different from the first refractive index. For example, the refractive index of silicon oxide film ($SiO_2$) is 1.4, the refractive index of titanium oxide film ($TiO_2$) is 2.4, and the refractive index of aluminum oxide film ($Al_2O_3$) is 1.7. Accordingly, when the silicon oxide film ($SiO_2$) and the titanium oxide film ($TiO_2$), which have a large refractive index difference therebetween, are formed into the first deposition layer and the second deposition layer, a high-gloss ceramic texture effect is capable of being advantageously exhibited. According to an embodiment, the first deposition layer and the second deposition layer may include a ternary material, which may be formed by reacting a metal/non-metal material and at least two materials selected from oxygen, nitrogen, and carbon. According to an embodiment, the ternary material may include TiSiCN, TiAlN, AlCrN, or AlTiN.

According to various embodiments, the reflectance of the metal preform 420 after deposition may range from 10% to 80%. According to an embodiment, the gloss of the metal preform 420 after deposition may have at least 75 GU when measured using a 60-degree (measurement angle) gloss meter.

According to various embodiments, various pre-treatment processes such as a plasma etching treatment, an ion source treatment, or an etching treatment using a gun may be performed for a hydrophilic treatment of the oxide film 420 before the deposition process.

According to various embodiments, in step 313, as illustrated in FIG. 4F, an antifouling layer 440 is formed on the deposition layer 430 to complete the housing 400. According to an embodiment, the etching treatment may be performed before the antifouling layer 440 is formed. According to an embodiment, the antifouling layer 440 may be formed by a wet or dry hydrophobic or hydrophilic treatment process for enhancing an anti-fingerprint property. According to an embodiment, a method for forming the antifouling layer 440 may include an AF (anti-fingerprint) treatment process, an invisible-finger (IF) treatment process, or an anti-smudge (AS) treatment process. According to an embodiment, the antifouling layer 440 may be made of various UV-curable materials in the form of fingerprint-resistant additives.

According to various embodiments, it is possible to provide a method of manufacturing a metal housing, the method including: forming a metal preform made of a metal material; pre-treating the surface of the metal preform so as to impart the surface with predetermined gloss and flatness; anodizing a flat face of the metal preform so as to form a predetermined oxide film thereon; coloring the oxide film using a colorant having a desired color; performing pore-sealing to maintain the performance and characteristic of the colorant of the colored oxide film; and laminating at least one deposition layer on the oxide film subjected to the pore-sealing.

According to various embodiments, the metal member may be formed of at least one of Al, Mg, Zn, Ti, Ta, Hf, or Nb.

According to various embodiments, the metal member may be formed by at least one of cutting by a CNC machine, pressing, forging, injection molding, die-casting, or mechanical joining.

According to various embodiments, the process of pre-treating the metal preform may include a polishing process for flattening the surface of the metal preform using an abrasive.

According to various embodiments, the colorant may include at least one of an organic/inorganic pigment, an organic dye, silver, or pearl, which fills at least a portion of the pore in the oxide film formed by the anodizing process.

According to an embodiment, the deposition layer may be formed of at least one of a Ti-based material, a Sn-based material, a Cr-based material, a Si-based material, a Zr-based material, and an Al-based material.

According to various embodiments, the deposition layer may be formed through a method of laminating at least two unit deposition layers having different refractive indexes.

According to various embodiments, the deposition layer may be formed such that at least two materials of $SiO_2$, $TiO_2$, $Ti_3O_5$, $Al_2O_3$, $ZrO_2$, and $Ta_2O_5$, among oxides, SiN, $SiN_x$, $Si_3N_4$, TiN, ZrN, AlN, among nitrides, or TiC, SiC, WC, and CrC, among carbonates, are laminated multiple times.

According to various embodiments, the deposition layer may include: a first deposition layer having a first refractive index and formed of at least two mixtures of $SiO_2$, $TiO_2$, $Ti_3O_5$, $Al_2O_3$, $ZrO_2$, and $Ta_2O_5$, among oxides, SiN, $SiN_x$, $Si_3N_4$, TiN, ZrN, and AlN, among nitrides, or TiC, SiC, WC, and CrC, among carbonates, are laminated multiple times; and a second deposition layer having a second refractive index and formed of at least two mixtures of $SiO_2$, $TiO_2$, $Ti_3O_5$, $Al_2O_3$, $ZrO_2$, and $Ta_2O_5$, among oxides, SiN, $SiN_x$, $Si_3N_4$, TiN, ZrN, and AlN, among nitrides, or TiC, SiC, WC, and CrC, among carbonates, laminated multiple times, and the first deposition layer and the second deposition layer may be alternately deposited multiple times.

According to various embodiments, the first deposition layer and the second deposition layer may include a ternary material, which may be formed by reacting a metal/non-metal material and at least two materials selected from oxygen, nitrogen, and carbon.

According to various embodiments, before forming the deposition layer, at least one of a plasma etching treatment, an ion source treatment, and an etching treatment using a gun may further be performed on a layer formed with the oxide film layer for a hydrophilic treatment.

According to various embodiments, the method may further include forming an antifouling layer on the deposition layer.

According to various embodiments, the antifouling layer may be formed using at least one of an AF (anti-fingerprint) treatment process, an invisible-finger (IF) treatment process, or an anti-smudge (AS) treatment process.

According to various embodiments, the metal housing is formed to have a reflectance of 10% to 80%.

According to various embodiments, the metal housing may be formed to have gloss of at least 75 GU when measured using a gross meter at a measurement angle of 60 degree.

According to various embodiments, it is possible to provide a metal housing manufactured using at least one of the above-described methods.

According to various embodiments, it is possible to provide an electronic device, to which a metal housing manufactured using at least one of the above-described methods is applied.

According to various embodiments, the metal housing may be applied to at least one of an outer housing, a battery cover, or an inner housing of the electronic device.

Various embodiments of the disclosure disclosed in this specification and drawings are provided merely to easily describe the technical contents of the disclosure and to help understanding of the embodiments of the disclosure, and are not intended to limit the scope of the disclosure. Accordingly, the scope of the various embodiments of the disclosure should be construed in such a manner that, in addition to the embodiments disclosed herein, all changes or modifications derived from the technical idea of the various embodiments of the disclosure are included in the scope of the various embodiments of the disclosure.

The invention claimed is:

1. A metal housing comprising:
    a metal preform;
    an oxide film layer disposed, through an anodizing process, on a flat face treated to have predetermined gloss and flatness on a surface of the metal preform, wherein the oxide film includes a plurality of hexagonal cells, each including a pore singularly disposed in a center portion of each hexagonal cell;
    a colored layer disposed in each pore of each hexagonal cell in the oxide film layer;
    a pore-sealing layer disposed above the colored layer in each pore of each hexagonal cell, filling each pore at least to a top surface of each hexagonal cell; and
    at least a first deposition layer formed on the oxide film layer including the pore-sealing layer, and a second deposition layer laminated onto the first deposition, wherein the first and second deposition layers include a ternary material; and
    an antifouling layer formed on the second deposition layer, and including an anti-smudge characteristic,
    wherein the metal housing is formed to have a reflectance of 10% to 80%, and
    wherein the metal housing is formed to have gloss of at least 75 Gloss Unit (GU) when measured using a gloss meter at a measurement angle of 60 degrees.

2. The metal housing of claim 1, wherein the metal preform contains at least one of Al, Mg, Zn, Ti, Ta, Hf, or Nb.

3. The metal housing of claim 1, wherein the metal preform is formed by at least one of cutting by a CNC machine, pressing, forging, injection molding, die-casting, or mechanical joining.

4. The metal housing of claim 1, wherein the metal preform has a metal preform surface flattened through a polishing process using an abrasive.

5. The metal housing of claim 1, wherein a colorant applied to the colored layer includes at least one of an organic/inorganic pigment, an organic dye, silver, or pearl, which fills at least a portion of the pore.

6. The metal housing of claim 1, wherein the deposition layer is formed using at least one of a Ti-based material, a Sn-based material, a Cr-based material, a Si-based material, a Zr-based material, and an Al-based material.

7. The metal housing of claim 1, wherein the first and second deposition layers are formed through a method of laminating at least two or more unit deposition layers having different refractive indexes.

8. The metal housing of claim 7, wherein the ternary material of the first and second deposition layers includes a metal/non-metal material reacted with at least two of oxygen, nitrogen and carbon.

9. The metal housing of claim 1, wherein the first and second depositions layer are formed by alternately forming the first deposition layer and the second deposition layer.

10. The metal housing of claim 1, wherein, before forming the deposition layer, the oxide film layer is subjected to a hydrophilic treatment through at least one of a plasma etching treatment, an ion source treatment, and an etching treatment using a gun.

11. The metal housing of claim 1, wherein the antifouling layer further includes at least one of an AF (anti-fingerprint) characteristic, an invisible-finger (IF) characteristic.

\* \* \* \* \*